US009073318B2

(12) United States Patent
Yoshikawa et al.

(10) Patent No.: US 9,073,318 B2
(45) Date of Patent: Jul. 7, 2015

(54) METHOD OF MANUFACTURING LIQUID DISCHARGE HEAD

(71) Applicant: CANON KABUSHIKI KAISHA, Tokyo (JP)

(72) Inventors: Masao Yoshikawa, Oita (JP); Keiichi Sasaki, Yokohama (JP); Takeru Yasuda, Oita (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 14/247,445

(22) Filed: Apr. 8, 2014

(65) Prior Publication Data

US 2014/0322835 A1 Oct. 30, 2014

(30) Foreign Application Priority Data

Apr. 26, 2013 (JP) ................................ 2013-094634

(51) Int. Cl.
*H01L 21/44* (2006.01)
*B41J 2/14* (2006.01)
*B41J 2/16* (2006.01)

(52) U.S. Cl.
CPC ............ *B41J 2/14129* (2013.01); *B41J 2/1603* (2013.01); *B41J 2/1628* (2013.01); *B41J 2/1629* (2013.01); *B41J 2/1631* (2013.01); *B41J 2/164* (2013.01)

(58) Field of Classification Search
CPC .................... H01L 21/0262; H01L 21/02126; H01L 21/0228; H01L 21/28194; H01L 29/783; H01L 51/0004; H01L 21/045; H01L 21/02527; H01L 27/1104; C07F 7/122; C07F 7/084; C23C 16/0218; C23C 16/453; C23C 18/1678; C30B 23/063
USPC ......... 438/474, 680, 706, 745, 471, 597, 617, 438/779, 509, 106, 122, 475; 257/E21.006, 257/E21.055, E21.077, E21.17, E21.229, 257/E21.246, E21.267, E21.256, E21.324
See application file for complete search history.

(56) References Cited

U.S. PATENT DOCUMENTS

| | | | | |
|---|---|---|---|---|
| 6,361,150 | B1 | 3/2002 | Schulte et al. | |
| 6,474,769 | B1 * | 11/2002 | Imanaka et al. | 347/19 |
| 6,773,091 | B2 * | 8/2004 | Miyamoto et al. | 347/64 |
| 7,374,275 | B2 | 5/2008 | Shibata et al. | |
| 7,566,116 | B2 | 7/2009 | Saito et al. | |
| 7,862,155 | B2 | 1/2011 | Shibata et al. | |
| 7,896,476 | B2 | 3/2011 | Kubo et al. | |
| 7,954,238 | B2 | 6/2011 | Shibata et al. | |
| 8,070,267 | B2 | 12/2011 | Takeuchi et al. | |
| 8,075,102 | B2 | 12/2011 | Hatsui et al. | |
| 8,129,204 | B2 * | 3/2012 | Saito et al. | 438/21 |
| 8,147,036 | B2 * | 4/2012 | Tsuji | 347/47 |
| 2010/0079551 | A1 | 4/2010 | Saito et al. | |

FOREIGN PATENT DOCUMENTS

JP 2003-165229 A 6/2003

* cited by examiner

*Primary Examiner* — David Nhu
(74) *Attorney, Agent, or Firm* — Fitzpatrick, Cella, Harper & Scinto

(57) ABSTRACT

A method of manufacturing a liquid discharge head is provided. The method includes forming a heating element on a substrate in which a semiconductor element is arranged. The method further includes forming a protection layer to contact an upper surface of the heating element. Annealing is performed in a hydrogen-containing atmosphere before the step of forming the protection layer.

13 Claims, 3 Drawing Sheets

METHOD OF MANUFACTURING LIQUID DISCHARGE HEAD

BACKGROUND OF THE INVENTION

1. Field of the Invention

The present invention relates to a method of manufacturing a liquid discharge head.

2. Description of the Related Art

There is known a thermal inkjet printing apparatus which prints by using a liquid discharge head configured to discharge ink by the action of thermal energy. A liquid discharge head manufactured by a method disclosed in Japanese Patent Laid-Open No. 2003-165229 includes a heating element for applying thermal energy to ink, a wiring pattern connected to the heating element, a protection layer which covers the heating element, and an anti-cavitation layer arranged on the protection layer. Japanese Patent Laid-Open No. 2003-165229 proposes that hydrogen alloying is performed before forming the anti-cavitation layer after forming the protection layer.

SUMMARY OF THE INVENTION

According to an aspect, a method of manufacturing a liquid discharge head is provided. The method includes forming a heating element on a substrate in which a semiconductor element is arranged, and forming a protection layer being in contact with an upper surface of the heating element. Annealing is performed in a hydrogen-containing atmosphere before the step of forming the protection layer.

According to another aspect, a method of manufacturing a liquid discharge head is provided. The method includes forming a heating element on a substrate in which a semiconductor element is arranged, and forming, above the heating element, a protection layer containing at least silicon and carbon. Annealing is performed in a hydrogen-containing atmosphere before the step of forming the protection layer.

According to still another aspect, a method of manufacturing a liquid discharge head is provided. The method includes forming a heater above a substrate on which a semiconductor element is arranged, forming a second wiring pattern above the heater, exposing part of the heater by removing part of the second wiring pattern, and forming a protection layer above the exposed part of the heater. The step of exposing part of the heater and the step of forming the protection layer are performed successively. Annealing is performed in a hydrogen-containing atmosphere before the step of forming the heater.

Further features of the present invention will become apparent from the following description of exemplary embodiments (with reference to the attached drawings).

DESCRIPTION OF THE EMBODIMENTS

Figure 1:
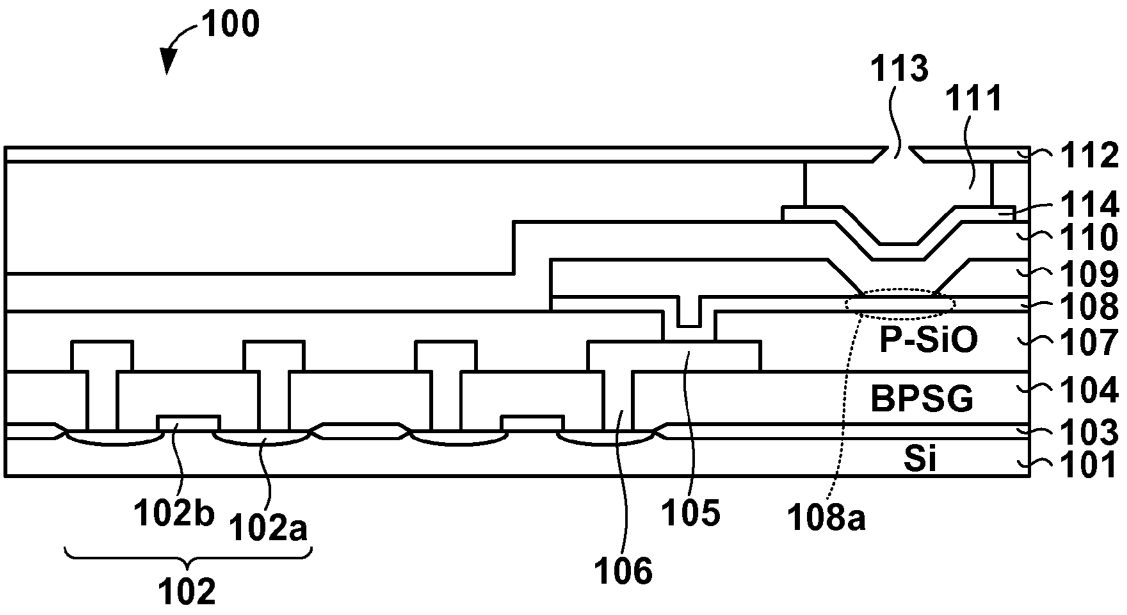
FIG. 1 is a sectional view for explaining an example of the structure of a liquid discharge head according to some embodiments.

Various embodiments will be explained below with reference to the accompanying drawings. The same reference numerals denote the same parts throughout the embodiments, and a repetitive description thereof will be omitted. The embodiments can be appropriately changed and combined.

In the method disclosed in Japanese Patent Laid-Open No. 2003-165229, hydrogen alloying is performed after forming a protection layer on a heating element. Hence, a problem may arise from the difference in heat-expansibility upon hydrogen alloying between the protection layer and the heating element. For example, the difference in heat-expansibility between the protection layer and the heating element may generate a crack in the protection layer, a layer arranged between the protection layer and the heating element, or the like. Embodiments to be described below suppress damage to the liquid discharge head by annealing.

An example of the structure of a liquid discharge head 100 according to some embodiments will be explained with reference to FIG. 1. FIG. 1 is a sectional view in which attention is paid to part of the liquid discharge head 100. The liquid discharge head 100 can discharge a droplet of a printing liquid used in an inkjet printing method. Semiconductor elements such as a MOS transistor 102 including diffusion regions **102*a* and a gate electrode 102*b* are arranged on one principal surface (front surface) of a silicon substrate 101. A gate insulating film (not shown) is arranged between the gate electrode 102*b* and the silicon substrate 101. The semiconductor elements constitute, for example, the driving circuit of the liquid discharge head 100. The semiconductor elements formed on the silicon substrate 101 are electrically separated (that is, insulated) by a field oxide film 103 on the front surface of the silicon substrate 101. A first interlayer insulating layer is arranged on the semiconductor elements and the field oxide film 103. In the embodiment, a BPSG (Boron Phosphorus Silicon Glass) film 104 is arranged as the first interlayer insulating layer. A first wiring pattern 105 is arranged on the BPSG film 104. The first wiring pattern 105 is connected to the semiconductor elements such as the MOS transistor 102 via contacts 106 extending through the BPSG film 104**.

A second interlayer insulating layer is arranged on the first wiring pattern 105. In the embodiment, a silicon oxide film 107 is arranged as the second interlayer insulating layer. A heater 108 and second wiring pattern 109 are arranged on the silicon oxide film 107. The heater 108 is made of a material containing, for example, tantalum. The first wiring pattern 105 and heater 108 are connected via a through hole formed in the silicon oxide film 107. The second wiring pattern 109 and heater 108 are directly connected. A portion of the heater 108 that is not covered with the second wiring pattern 109 functions as a heating element **108*a***.

A protection layer 110 is arranged to cover the heater 108 and second wiring pattern 109. The protection layer 110 directly contacts the heater 108 and second wiring pattern 109. The protection layer 110 suffices to be formed from a material which protects the heating element **108*a* from ink. For example, the protection layer 110 can be formed from a material containing Si (silicon) and C (carbon). The protection layer 110 may be formed from a material further containing N (nitrogen) in addition to Si and C. In another embodiment, the protection layer 110 can be formed from a material containing Si and N. The protection layer 110 may cover only the heating element 108*a* or the entire heater 108 and second wiring pattern 109. The protection layer 110 can improve the heat resistance and insulating property of the heating element 108*a*. The protection layer 110 can protect the heating element from ink stored in an ink chamber 111. The protection layer 110 can suppress permeation of ink into the silicon substrate 101** and suppress corrosion of the wiring pattern.

The ink chamber 111 is arranged on the protection layer 110 on the heating element 108*a*. When the heating element 108*a* generates heat, a liquid (ink) in the ink chamber 111 is discharged from an orifice 113 of a plate 112. An anti-cavitation layer 114 formed from, for example, tantalum may be arranged between the ink chamber 111 and the protection layer 110. The anti-cavitation layer 114 relaxes a mechanical shock to the protection layer 110 that is caused by cavitation generated in the ink chamber 111. The liquid discharge head 100 can further include an ink channel and ink supply port (neither is shown).

Figure 2:
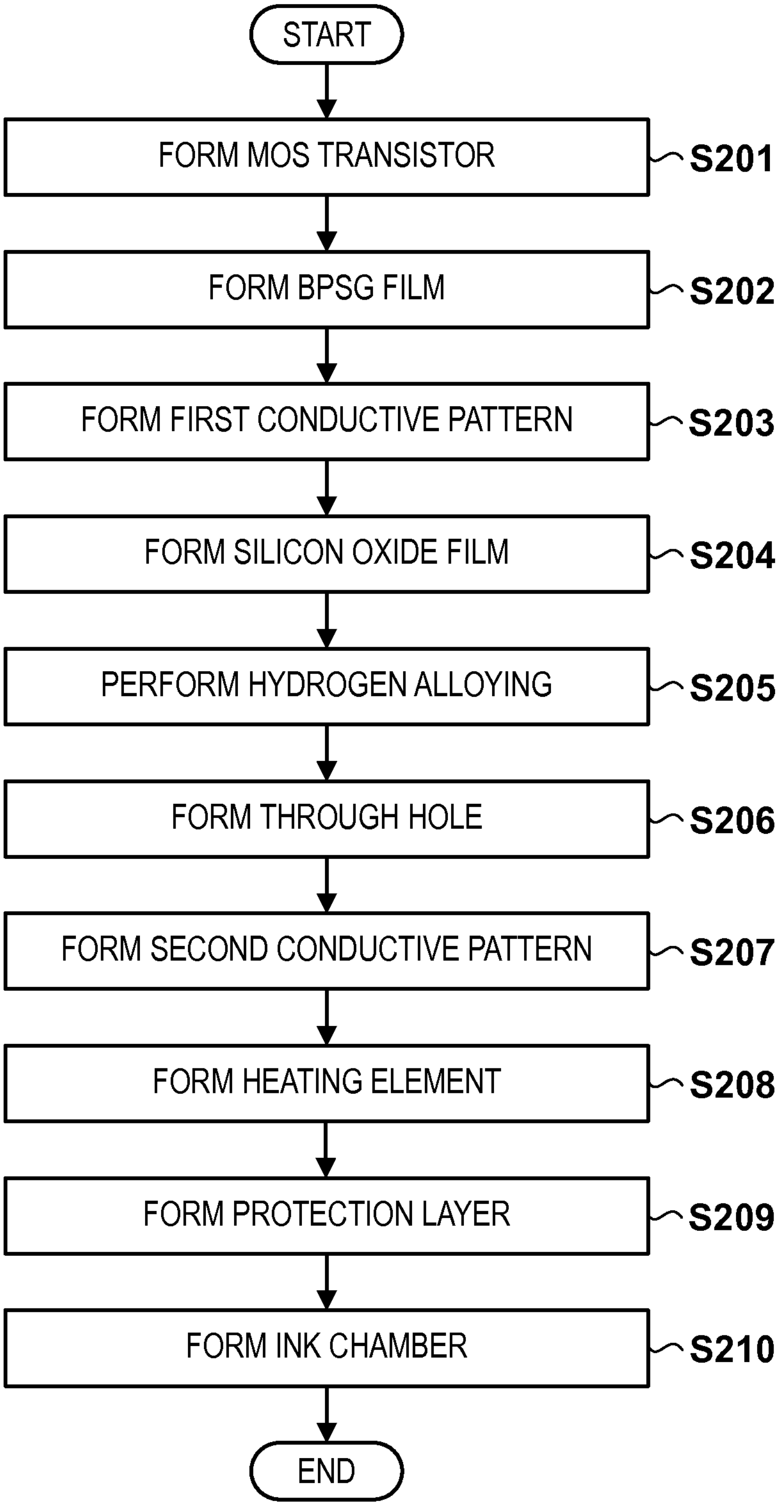
FIG. 2 is a flowchart for explaining an example of a method of manufacturing the liquid discharge head in FIG. 1.

An example of a method of manufacturing the liquid discharge head 100 will be explained with reference to FIGS. 2 and 3A to 3D. FIG. 2 is a flowchart showing the manufacturing method. FIGS. 3A to 3D are sectional views showing the liquid discharge head 100 in the halfway stages in the manufacturing method, and correspond to the sectional view of FIG. 1.

In step S201 of FIG. 2, a field oxide film 103 having a thickness of, for example, about 900 nm is selectively formed on part of one principal surface (front surface) of a silicon substrate 101 by thermal oxidation. A region of the silicon substrate 101 where the field oxide film 103 is not formed serves as an active region. By using an existing method for example, semiconductor elements such as a MOS transistor 102 including diffusion regions 102*a* and a gate electrode 102*b* are formed in the active region of the silicon substrate 101.

Figure 3A:
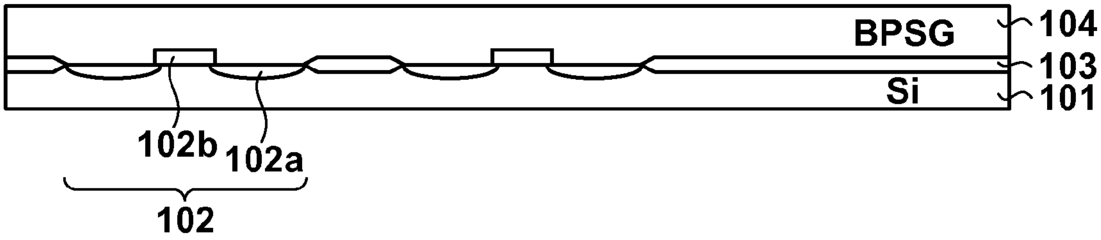
FIGS. 3A to 3D are sectional views for explaining respective steps in the method of manufacturing the liquid discharge head in FIG. 1.

Subsequently, in step S202, a BPSG film 104 having a thickness of, for example, 500 nm is formed on the entire surface of the silicon substrate 101 by atmospheric pressure CVD (Chemical Vapor Deposition). After that, reflow of the BPSG film 104 is performed by annealing at, for example, 850° C. for 1 h. The reflow of the BPSG film 104 may be omitted. By these steps, a structure shown in FIG. 3A is formed.

In step S203, via holes are formed in the BPSG film 104 by etching to expose part of the semiconductor elements. As the etching, for example, reactive ion etching using a plasma may be employed. Then, an Al/Si conductive film is formed on the entire surface of the silicon substrate 101 by sputtering at, for example, 150° C. Part of the conductive film formed in this step that is filled in each via hole of the BPSG film 104 serves as a contact 106. Photolithography and dry etching are performed on the conductive film to pattern the conductive film, thereby forming a first wiring pattern 105. The dry etching may use a plasma. The first wiring pattern 105 may be formed to electrically connect, to the silicon substrate 101, all the gate electrodes 102*b* formed at this time. For example, the gate electrode 102*b* and first wiring pattern 105 may be connected by a contact, and the silicon substrate 101 and first wiring pattern 105 may be connected by another contact. This connection can reduce charge-up to the gate electrodes 102*b* that occurs in subsequent steps.

In step S204, a silicon oxide film 107 having a thickness of, for example, 1 μm is formed by plasma CVD at 400° C. By these steps, a structure shown in FIG. 3B is formed.

Figure 3B:
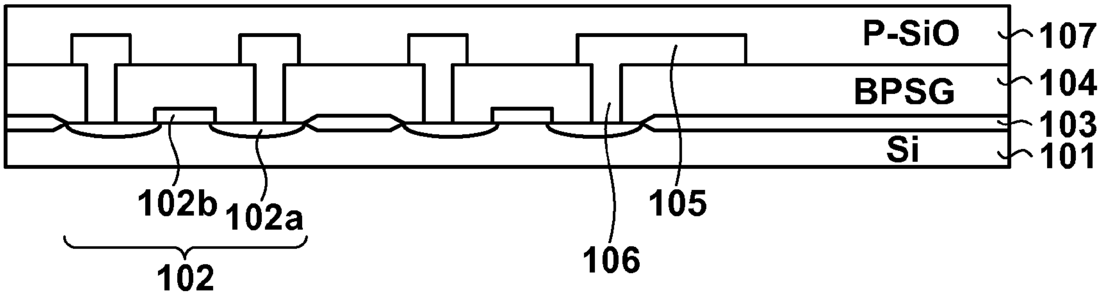

In step S205, annealing is performed on the structure shown in FIG. 3B in an annealing chamber in a hydrogen-containing atmosphere at 400° C. for 30 min. This annealing may be performed at more than 400° C. for more than 30 min. Annealing in a hydrogen-containing atmosphere can also be called hydrogen alloying. By this annealing, the silicon substrate 101 can recover from damage generated in previous steps. For example, charge-up to the silicon substrate 101 by the use of a plasma in steps S203 and S204 can be relaxed. This annealing stabilizes the connection between the first wiring pattern 105 (more specifically, the contact 106) and the semiconductor element (for example, its electrode). When the cross-sectional area of the contact 106 is large, the contact resistance between the contact 106 and the semiconductor element is low, and a satisfactorily stable connection can be ensured. In this case, the above-described annealing need not aim to stabilize the connection. Further, this annealing can terminate the dangling bond and as a result improve the reliability of the circuit. However, when high reliability is not required in a power device such as the liquid discharge head 100, the aforementioned annealing need not aim to terminate the dangling bond.

In step S206, for example, reactive ion etching is performed to form a through hole in the silicon oxide film 107 to expose part of the first wiring pattern 105. Then, in step S207, a Ta/Si/N heater 108 is formed by sputtering at 150 to 200° C., and an Al/Cu conductive film is formed on the heater 108. Photolithography and dry etching are performed on the Al/Cu conductive film to pattern the conductive film, thereby forming a second wiring pattern 109. In step S208, photolithography and wet etching are performed on the second wiring pattern 109 to remove part of the second wiring pattern 109 and expose part of the upper surface of the heater 108, thereby forming a heating element 108*a*. By these steps, a structure shown in FIG. 3C is formed.

Figure 3C:
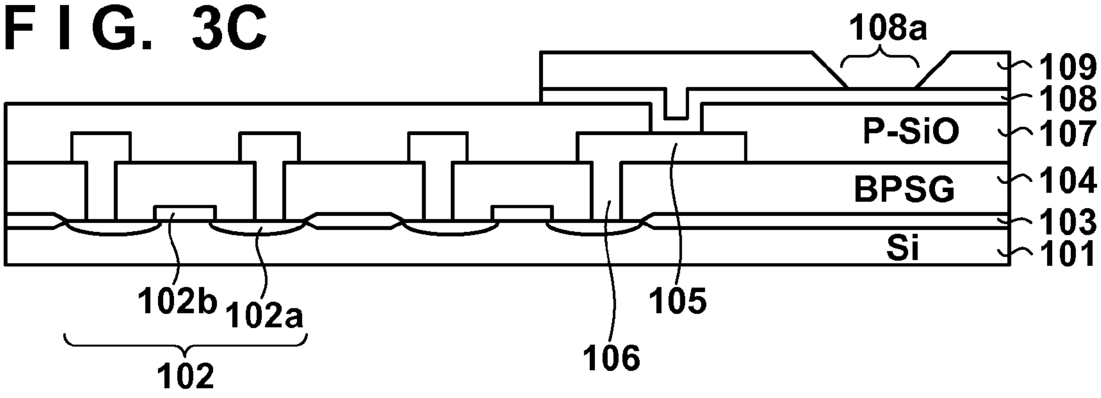
Figure 3D:
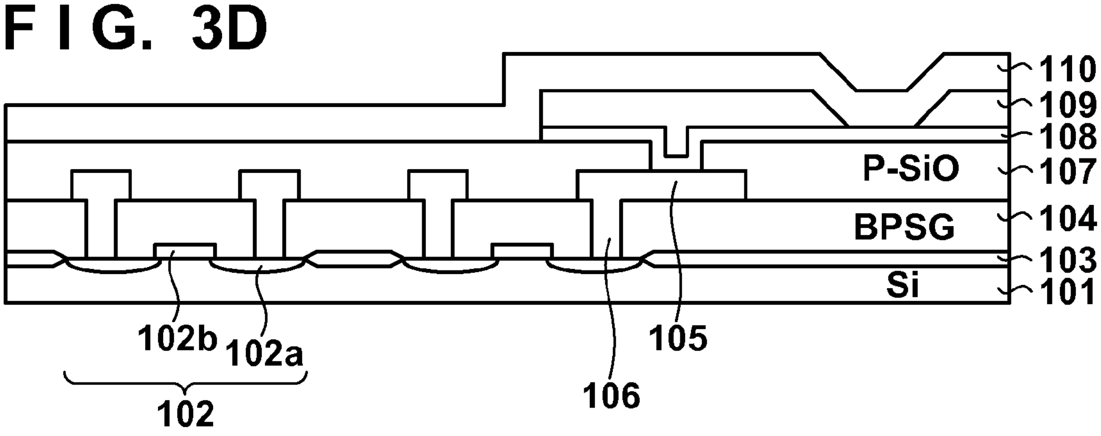

In step S209, a protection layer 110 having a thickness of about 300 to 400 nm is formed on the structure shown in FIG. 3C by plasma CVD at 400° C. for about several ten sec. The protection layer 110 can be formed from a Si/C/N material which satisfies $Si_xC_yN_z$ (where x+y+z=100, 30≤x≤60, y≥5, and z≥15). The protection layer 110 may be formed from a Si/C material. By these steps, a structure shown in FIG. 3D is formed.

In the embodiment, the protection layer 110 is formed to contact the upper surface of the heating element 108*a* without performing a process of depositing another layer on the upper surface of the heating element 108*a* after exposing the heating element 108*a*. That is, the step of exposing the heating element 108*a* and the step of forming the protection layer 110 are performed successively. However, a coating film may be formed on the surface of the heating element 108*a* in a step between formation of the heater 108 and formation of the protection layer 110. Such a coating film can be part of the heating element 108*a*. For example, a plasma is used when asking is performed on a resist serving as a mask after wet etching. By the action of the plasma, a coating film of an oxide can be formed on the surface of the heating element 108*a*.

In step S210, the protection layer 110 is patterned to extract an electrode. After that, an anti-cavitation layer 114 is formed to cover, from above the protection layer 110, a portion of the heater 108 that functions as the heating element 108*a*. Further, an ink chamber 111, plate 112, orifice 113, ink channel, ink supply port, and the like are formed. By these steps, the liquid discharge head 100 shown in FIG. 1 is formed. In steps after step S209 of forming the protection layer 110, processing higher in thermal load than annealing in step S205 is not performed. For example, in step S210, the anti-cavitation layer 114 is formed by processing lower in thermal load than annealing in step S205. Here, thermal loads can be compared by a known method. For example, thermal loads can be compared based on the temporal integration of the process temperature. Although the anti-cavitation layer 114 is formed in the above-described embodiment, it may not be formed in other embodiments.

In the above-described embodiment, annealing in step S205 is performed before formation of the protection layer 110 in step S209. Therefore, hydrogen alloying can be performed without applying the thermal load to the protection layer 110, unlike annealing in step S205 (for example, annealing at 400° C. for 30 min). This can suppress generation of a crack in the protection layer 110 caused by to the heat stress arising from the difference in heat-expansibility between the protection layer 110 and the heating element 108*a* and between the protection layer 110 and the second wiring pattern 109.

In another embodiment, an interlayer film such as a silicon oxide film is arranged between the heating element 108*a* and the protection layer 110. Even in this case, if the thermal load is applied to the protection layer 110, a crack may be generated in the protection layer 110 or interlayer film owing to the heat stress arising from the difference in heat-expansibility between the protection layer 110 and the heating element 108*a* and between the protection layer 110 and the second wiring pattern 109. By performing hydrogen alloying without applying the thermal load to the protection layer 110, generation of a crack can be suppressed.

If hydrogen alloying is performed after forming the protection layer 110, hydrogen may not satisfactorily reach the structure below the protection layer 110 owing to the hydrogen storage of carbon contained in the protection layer 110, and the effect of hydrogen alloying may not be obtained. In the embodiment, hydrogen alloying is performed before forming the protection layer 110. Thus, even if the protection layer 110 contains carbon, the effect of hydrogen alloying can be obtained satisfactorily. As described above, the embodiment improves the durability and quality of the liquid discharge head 100.

In the above-described embodiment, annealing in step S205 is performed after forming the silicon oxide film 107 in step S204. The annealing can reduce (recover) damage by a plasma generated for the silicon oxide film 107. In other embodiments, annealing in step S205 may be performed before forming the silicon oxide film 107 in step S204.

In the above-described embodiment, annealing in step S205 is performed before forming the second wiring pattern 109 in step S207. This can reduce the possibility at which a hillock is generated in the second wiring pattern 109. When no hydrogen alloying is performed after forming the second wiring pattern 109, the connection between the first wiring pattern 105 and the heater 108 is not stabilized by hydrogen alloying. In this case, sufficient stability can be ensured by setting the aperture of the via hole of the silicon oxide film 107 to be 4 μm or larger.

In a step after forming the first wiring pattern 105, for example, when forming the second wiring pattern 109, charge-up may occur in the first wiring pattern 105 and charges may be accumulated in even the gate electrode 102*b* connected to the first wiring pattern. As a result, a high voltage is applied to the gate oxide film immediately below the gate electrode 102*b*, making the threshold characteristic of the MOS transistor 102 unstable. To prevent this, according to the embodiment, the gate electrode 102*b* is electrically connected to the silicon substrate 101 via the first wiring pattern 105 to set the gate electrode 102*b* and silicon substrate 101 at the same potential. This can prevent application of a voltage to the gate oxide film upon charge-up. That is, when annealing is performed before forming the second wiring pattern 109, the possibility at which the semiconductor element is damaged can be reduced. In another embodiment, annealing in step S205 may be performed after forming the second wiring pattern 109 in step S207.

The timing of annealing described in the aforementioned embodiment is merely an example. Annealing can be performed at an arbitrary timing before forming a protection layer after arranging semiconductor elements on a substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-094634, filed Apr. 26, 2013 which is hereby incorporated by reference herein in its entirety.

What is claimed is:

1. A method of manufacturing a liquid discharge head, the method comprising:
forming a heating element on a substrate in which a semiconductor element is arranged; and
after the forming of the heating element, forming a protection layer being in contact with an upper surface of the heating element,
wherein annealing is performed in a hydrogen-containing atmosphere before the forming of the protection layer.

2. A method of manufacturing a liquid discharge head, the method comprising:
forming a heating element on a substrate in which a semiconductor element is arranged; and
forming, above the heating element, a protection layer containing at least silicon and carbon,
wherein annealing is performed in a hydrogen-containing atmosphere before the forming of the protection layer.

3. The method according to claim 2, further comprising:
forming a first interlayer insulating layer above the substrate;
forming, above the first interlayer insulating layer, a first wiring pattern connected to the semiconductor element;
forming a second interlayer insulating layer above the first wiring pattern; and
forming a second wiring pattern above the second interlayer insulating layer,
wherein the heating element is formed above the second interlayer insulating layer and connected to the first wiring pattern.

4. The method according to claim 3, wherein the annealing is performed after the forming of the first wiring pattern.

5. The method according to claim 3, wherein the annealing is performed before the forming of the second wiring pattern.

6. The method according to claim 3, wherein the annealing is performed after the forming of the second interlayer insulating layer.

7. The method according to claim 3, wherein:
the semiconductor element includes a MOS transistor, and
in the forming of the first wiring pattern, a gate electrode of the MOS transistor is electrically connected to the substrate via the first wiring pattern.

8. The method according to claim 2, wherein a plasma is used before the annealing.

9. The method according to claim 2, wherein the annealing is performed at a temperature of 400° C. or more for 30 min or more.

10. The method according to claim 2, wherein after the forming of the protection layer, processing higher in thermal load than the annealing is not performed.

11. The method according to claim 2, further comprising forming an anti-cavitation layer above the protection layer after the forming of the protection layer.

12. The method according to claim 2, wherein the protection layer contains nitrogen.

13. A method of manufacturing a liquid discharge head, the method comprising:

forming a heater on a substrate in which a semiconductor element is arranged;

forming a wiring pattern above the heater;

exposing part of the heater by removing part of the wiring pattern; and forming a protection layer above the exposed part of the heater, wherein the exposing of the part of the heater and the forming of the protection layer are performed successively, and annealing is performed in a hydrogen-containing atmosphere before the forming of the heater.

* * * * *